(12) United States Patent
Nakano et al.

(10) Patent No.: US 9,012,256 B2
(45) Date of Patent: Apr. 21, 2015

(54) PROCESS FOR PRODUCING PHOTOVOLTAIC DEVICE

(75) Inventors: Shinya Nakano, Tokyo (JP); Yoshiaki Takeuchi, Tokyo (JP); Michio Kondo, Tsukuba (JP); Takuya Matsui, Tsukuba (JP)

(73) Assignees: Mitsubishi Heavy Industries, Ltd., Tokyo (JP); National Institute of Advanced Industrial Science and Technology, Tsukuba-shi, Ibaraki (JP)

( * ) Notice: Subject to any disclaimer, the term of this patent is extended or adjusted under 35 U.S.C. 154(b) by 36 days.

(21) Appl. No.: 13/808,738

(22) PCT Filed: Sep. 28, 2011

(86) PCT No.: PCT/JP2011/072262
§ 371 (c)(1),
(2), (4) Date: Jan. 7, 2013

(87) PCT Pub. No.: WO2012/046606
PCT Pub. Date: Apr. 12, 2012

(65) Prior Publication Data
US 2013/0109130 A1 May 2, 2013

(30) Foreign Application Priority Data

Oct. 6, 2010 (JP) ................ 2010-226840

(51) Int. Cl.
*H01L 31/20* (2006.01)
*H01L 31/18* (2006.01)
(Continued)

(52) U.S. Cl.
CPC .......... *H01L 31/202* (2013.01); *H01L 31/1804* (2013.01); *H01L 31/03762* (2013.01); *H01L 31/0747* (2013.01); *Y02E 10/547* (2013.01)

(58) Field of Classification Search
USPC .......................................... 438/87
See application file for complete search history.

(56) References Cited

U.S. PATENT DOCUMENTS 4,330,182 A * 5/1982 Coleman .................. 257/56
(Continued)

FOREIGN PATENT DOCUMENTS

JP    H04-168759 A    6/1992
(Continued)

OTHER PUBLICATIONS

PCT, "International Search Report and Written Opinion for PCT/JP2011/072262", Nov. 8, 2011.
(Continued)

*Primary Examiner* — Charles Garber
*Assistant Examiner* — Stanetta Isaac
(74) *Attorney, Agent, or Firm* — Benjamin Hauptman; Manabu Kanesaka; Kenneth Berner

(57) ABSTRACT

A process for producing a photovoltaic device that can improve the power generation characteristics of a solar cell having a heterojunction composed of a p-type crystalline Ge (substrate), an i-type amorphous silicon semiconductor layer, and an n-type amorphous silicon semiconductor layer. A process for producing a photovoltaic device (100) comprising a heterojunction cell (1) prepared by sequentially stacking an i-type amorphous silicon semiconductor layer (12) and an n-type amorphous silicon semiconductor layer (13) on top of a substrate (p-type crystalline Ge (11)), the process comprising a $PH_3$ exposure treatment stage of adjusting the temperature of the substrate (11), from which a surface oxide film has been removed, to a prescribed temperature, and subsequently placing the substrate in a vacuum chamber and exposing the substrate to $PH_3$, an i-layer deposition stage of depositing the i-type amorphous silicon semiconductor layer (12) on the $PH_3$-exposed substrate, an n-layer deposition stage of depositing the n-type amorphous silicon semiconductor layer (13) on the i-type amorphous silicon semiconductor layer (12), and an electrode formation stage of forming electrodes (2, 3, 4) on the surface of the n-type amorphous silicon semiconductor layer, and on the back surface of the substrate (11).

7 Claims, 9 Drawing Sheets

(51) Int. Cl.
*H01L 31/0376* (2006.01)
*H01L 31/0747* (2012.01)

(56) References Cited

U.S. PATENT DOCUMENTS

| | | | | |
|---|---|---|---|---|
| 4,582,721 | A * | 4/1986 | Yoshino et al. | 438/96 |
| 5,024,706 | A * | 6/1991 | Kanai et al. | 136/258 |
| 5,252,142 | A * | 10/1993 | Matsuyama et al. | 136/255 |
| 6,207,890 | B1 * | 3/2001 | Nakai et al. | 136/246 |
| 2010/0047952 | A1 * | 2/2010 | Ohnuma et al. | 438/58 |

FOREIGN PATENT DOCUMENTS

| | | |
|---|---|---|
| JP | 2771921 B2 | 4/1998 |
| JP | 2011-181852 A | 9/2011 |
| WO | 89/04551 A1 | 5/1989 |
| WO | 98/43304 A1 | 10/1998 |
| WO | 03/085746 A1 | 10/2003 |

OTHER PUBLICATIONS

Hidenori Mimura, "Study on the Properties of Hydrogenated Amorphous Silicon-Single Crystaline Silicon Heterojunctions", National University Corporation Shizuoka University Hakushi Ronbun, National University Corporation Shizuoka University, Mar. 20, 1987, pp. 128-133.

Yoshinori Hatanaka, "Heterostructures with Hydrogenated Amorphous Silicon for Use in Imaging Devices", Applied Surface Science, 1991, vol. 48-49, pp. 457-463.

Japan Patent Office, "Decision to Grant a Patent for JP 2010-226840," Sep. 2, 2014.

Japan Patent Office, "Office Action for JP 2010-226840," Jun. 10, 2014. X.

Shinya Nakano et al., "Development of Heterojunction Solar Cell using Monocrystal Ge Substrate," The Japan Society of Applied Physics extended abstracts of the 71st Autumn Meeting, Aug. 30, 2010.

Tetsuya Kaneko et al., "Study of Substrate Cleaning for Producing Heterojunction Solar Cell using Monocrystal Ge Substrate," The Japan Society of Applied Physics extended abstracts of the 57th Spring Meeting, Mar. 3, 2010.

Taiwan Patent Office, "Notice of Allowance for TW100136087," Dec. 26, 2014.

* cited by examiner

PROCESS FOR PRODUCING PHOTOVOLTAIC DEVICE

RELATED APPLICATIONS

The present application is National Phase of International Application No. PCT/JP2011/072262 filed Sep. 28, 2011, and claims priority from, Japanese Application no. 2010-226840, filed Oct. 6, 2010.

TECHNICAL FIELD

The present invention relates to a process for producing a photovoltaic device, and relates particularly to a process for producing a solar cell having a heterostructure.

BACKGROUND ART

Solar cells are known as photovoltaic devices that convert the energy from sunlight into electrical energy (for example, see PTL 1). In recent years, with the aim of improving the conversion efficiency of solar cells, much research and development has been conducted of solar cells having a heterostructure that uses a narrow-gap material such as germanium (Ge) or a silicon (Si)—Ge-tin (Sn) alloy. Ge has a band gap of 0.66 eV, and this is smaller than the band gap (1.1 eV) of the crystalline Si used in conventional photovoltaic layers. By using this type of narrow-gap material, the absorption of longer wavelength light, which until now has not been able to be utilized, can be increased, enabling further improvement in the conversion efficiency of the solar cell.

CITATION LIST

Patent Literature

{PTL 1} Publication of Japanese Patent No. 2,771,921 (claim 1)

SUMMARY OF INVENTION

Technical Problem

One example of a solar cell having a heterostructure that uses a narrow-gap material is a solar cell comprising a p-type crystalline Ge as a substrate, and a heterojunction cell prepared by sequentially stacking an i-type amorphous silicon semiconductor layer and an n-type amorphous silicon semiconductor layer on top of the substrate.

When a p-type crystalline Ge is used as the substrate, the substrate is first washed with an organic solvent and a detergent. Because an oxide film (GeOx) is formed on the surface of the washed substrate, the substrate is first heated to remove the oxide film, and the i-type amorphous silicon semiconductor layer and the n-type amorphous silicon semiconductor layer are then stacked sequentially on the substrate.

However, in a solar cell having a heterojunction prepared in this manner, a problem arises in that the desired power generation characteristics cannot be obtained.

Further, in a different production process, with the object of optimizing the size of the texture on the surface of the back electrode, a polycrystalline germanium layer having very fine hemispherical texture formed in a dense pattern on the surface of the layer is formed by first performing solid-phase growth of an amorphous germanium containing an added n-type dopant on an electrically insulating substrate by performing an annealing treatment at 350° C., and subsequently performing an etching treatment (PTL 1). However, the output current; Isc does not reach 20 mA/cm$^2$, meaning the desired power generation characteristics cannot be obtained.

The present invention has been developed in light of the above circumstances, and has an object of providing a process for producing a photovoltaic device that can improve the power generation characteristics of a solar cell having a heterojunction composed of a p-type crystalline Ge (substrate), an i-type amorphous silicon semiconductor layer, and an n-type amorphous silicon semiconductor layer.

Solution to Problem

In order to achieve the above object, the present invention provides a process for producing a photovoltaic device comprising a p-type crystalline Ge as a substrate, and a heterojunction cell prepared by sequentially stacking an i-type amorphous silicon semiconductor layer and an n-type amorphous silicon semiconductor layer on top of the substrate, the process comprising a $PH_3$ exposure treatment stage of adjusting the temperature of the substrate, from which an oxide film formed on the surface thereof has been removed, to a prescribed temperature, and subsequently placing the substrate in a vacuum chamber and exposing the substrate to $PH_3$ gas, an i-layer deposition stage of depositing an i-type amorphous silicon semiconductor layer on the $PH_3$-exposed substrate, an n-layer deposition stage of depositing an n-type amorphous silicon semiconductor layer on the i-type amorphous silicon semiconductor layer, and an electrode formation stage of forming an electrode on the n-type amorphous silicon semiconductor layer, and forming an electrode on the surface of the substrate opposite the surface on which the i-type amorphous silicon semiconductor layer has been deposited.

When the p-type crystalline Ge (substrate) is heated, oxygen (O) sublimes, and the oxide film on the substrate surface is removed. As a result of intensive research, the inventors of the present invention discovered that the reason the desired power generation characteristics could not be obtained is because the substrate surface from which the oxide film has been removed is covered in dangling bonds, and exhibits strong p-type characteristics due to the existence of a stable state within the valence band.

In the present invention, by subjecting the substrate from which the oxide film has been removed to a $PH_3$ exposure treatment, the $PH_3$ gas adsorbs (or bonds) to the substrate surface, enabling the Fermi level of the substrate surface to be restored to close to its intrinsic level. By subsequently stacking an i-type amorphous silicon semiconductor layer and an n-type amorphous silicon semiconductor layer on top of this type of substrate, the power generation characteristics of the photovoltaic device can be improved dramatically.

In one aspect of the invention described above, the prescribed temperature for the substrate in the $PH_3$ exposure treatment stage is preferably not less than 150° C.

A higher substrate temperature during the $PH_3$ exposure treatment has the effect of improving the cell performance, and this effect increases at substrate temperatures of 150° C. or higher.

In one aspect of the invention described above, the production process preferably further comprises, after the electrode formation stage, an annealing treatment stage of applying heat to perform an annealing treatment.

By performing an annealing treatment after the electrode formation stage, the power generation characteristics of the photovoltaic device comprising the heterojunction can be further improved. The annealing treatment is particularly effective in those cases where the prescribed temperature for the substrate in the PH$_3$ exposure treatment stage is set to a low value.

Prior to the PH$_3$ exposure treatment stage, the temperature of the substrate is adjusted to a prescribed temperature. When the prescribed temperature is set to a low value, the substrate may be heated with a heat source during the PH$_3$ exposure treatment stage. When the prescribed temperature is set to a high value, the substrate can be exposed to the PH$_3$ with the temperature of the substrate stabilized at a high temperature. This enables the power generation characteristics of the resulting photovoltaic device to be improved. Further, the inventors found that a similar effect could also be achieved by applying heat and performing an annealing treatment after the PH$_3$ exposure treatment. Including the annealing treatment stage removes any limitation with regard to specifying the substrate temperature during the PH$_3$ exposure treatment stage, and therefore a temperature control device can be omitted from the vacuum chamber used for performing the PH$_3$ exposure treatment. Moreover, even in those cases where the vacuum chamber for the PH$_3$ exposure treatment is an n-layer deposition chamber, the chamber can also be used for the PH$_3$ exposure treatment with the heater temperature fixed at the value required for the p-layer deposition.

In one aspect of the invention described above, the production process preferably also comprises, at least one of prior to the PH$_3$ exposure treatment stage or after the PH$_3$ exposure treatment stage, an electron beam irradiation stage of irradiating an electron beam onto the substrate.

By irradiating an electron beam onto the substrate, the substrate temperature can be increased. Further, the energy of the electrons can also accelerate the reaction between the surface of the p-type crystalline Ge and the PH$_3$. As a result, the power generation characteristics of the photovoltaic device comprising the heterojunction cell can be further increased.

In one aspect of the invention described above, a p-type crystalline Ge having a thickness of not less than 1.5 μm and not more than 500 μm is preferably used as the substrate.

By setting the thickness of the p-type crystalline Ge within the range specified above, the amount of power generated by the photovoltaic device comprising the heterojunction cell can be increased. Provided the thickness of the p-type crystalline Ge is not less than 5 μm, light up to a wavelength of approximately 1,500 nm, which represents the wavelengths for which Ge exhibits a high absorption coefficient, can be absorbed satisfactorily, and therefore by effectively utilizing the reflection and scattering at the back electrode, the substrate thickness can be reduced to 1.5 μm. Further, if the thickness of the p-type crystalline Ge is increased to 200 μm, then satisfactory absorption can be achieved for light up to a wavelength of approximately 1,600 nm. On the other hand, if the thickness of the p-type crystalline Ge is increased beyond 200 μm, then absorption is possible for light of wavelengths near the band edge, although the thickness is preferably not more than 500 μm in order to achieve a practically applicable thickness that is able to maintain the strength of the substrate during handling, while suppressing any temperature difference through the thickness direction of the substrate. However, for a substrate having a resistivity of not more than approximately 0.5 Ωcm used in a practical photovoltaic device, because free carrier absorption exists in the wavelength region near the band edge, even if light having a wavelength near the band edge is absorbed, no significant increase in the current density is observed, and therefore in order to avoid increasing the substrate thickness unnecessarily, the thickness is preferably not more than 200 μm.

In one aspect of the invention described above, the production process preferably also comprises, prior to the electrode formation stage, a back surface heterostructure formation stage of forming a p-type amorphous silicon semiconductor layer on the surface of the substrate opposite the surface on which the i-type amorphous silicon semiconductor layer has been deposited.

By forming a p-type amorphous silicon semiconductor layer on the back surface, the electrical activity (carrier recombination) of the impurity element of the p-type crystalline Ge can be reduced. As a result, the current density and the open-circuit voltage can be improved.

Advantageous Effects of Invention

In the present invention, by exposing a p-type crystalline Ge from which the oxide film has been removed to PH$_3$, the Fermi level of the surface of the p-type crystalline Ge can be restored to close to its intrinsic level. By subsequently stacking an i-type amorphous silicon semiconductor layer and an n-type amorphous silicon semiconductor layer on top of this type of p-type crystalline Ge, the power generation characteristics of the resulting photovoltaic device can be improved.

DESCRIPTION OF EMBODIMENTS

An embodiment of the process for producing a photovoltaic device according to the present invention is described below with reference to the drawings.

First Embodiment

Figure 1:
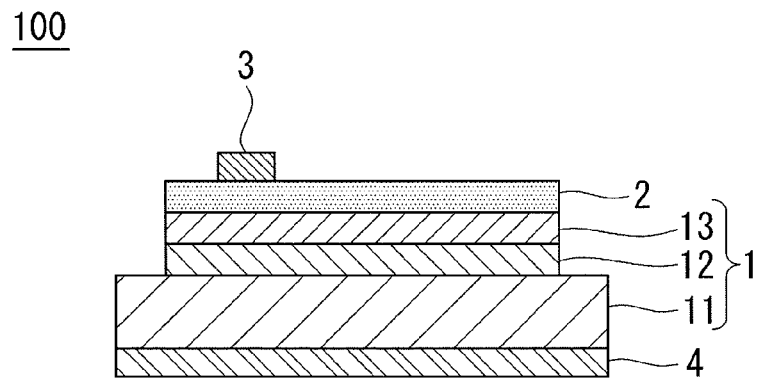
FIG. 1 is a schematic view illustrating an example of the structure of a photovoltaic device according to a first embodiment.

FIG. 1 is a schematic view illustrating an example of the structure of a photovoltaic device according to a first embodiment. The photovoltaic device 100 is a solar cell having a heterostructure, and comprises a heterojunction cell layer 1, a transparent electrode layer 2, a grid electrode 3, and a back electrode layer 4.

The heterojunction cell layer 1 is composed of a p-type monocrystalline Ge (substrate 11), an i-type amorphous silicon layer 12 and an n-type amorphous silicon layer 13.

For the substrate 11, a Ga-doped p-type monocrystalline Ge (100) (c-Ge) grown by the Czochralski (CZ) method is used. The thickness of the c-Ge is not less than 1.5 µm and not more than 500 µm, and preferably not less than 50 µm and not more than 200 µm. The i-type amorphous silicon layer 12 comprises mainly amorphous silicon, and has a thickness of not less than 5 nm and not more than 80 nm. The n-type amorphous silicon layer 13 comprises mainly P-doped silicon in which an amorphous silicon is doped with a phosphorus component P, and has a thickness of not less than 4 nm and not more than 10 nm.

The p-type monocrystalline Ge (substrate 11) may also employ substrates produced using other crystal growing methods or produced using Ge (111). Further, the substrate is not limited to p-type monocrystalline Ge, and by optimizing the surface treatment, polycrystalline Ge can also be used in a similar manner.

The transparent electrode layer 2 is a film comprising a metal oxide such as indium tin oxide (ITO), tin oxide ($SnO_2$) or zinc oxide (ZnO) as the main component. From the viewpoints of the resistance and the light reflection properties, the thickness of the transparent electrode layer 2 is typically not less than 50 nm and not more than 150 nm.

The grid electrode 3 is a film composed mainly of Ag, but by optimizing the deposition process, other highly conductive materials such as Al can also be used. While ensuring suppression of resistance, the width of the grid is preferably narrowed to reduce the surface area of the substrate surface covered by the electrode, so that light incidence is not impeded.

The back electrode layer 4 is a film composed of Al, and has a thickness of not less than 50 nm and not more than 500 nm. A film composed of Ag can be used to improve the reflectance, or a film composed of Cu can be used to reduce the costs.

Ag and Cu react readily with some atmospheric components (such as oxygen, water vapor and sulfur), and therefore the surface of the Ag or Cu may be coated with Ti or N, or an innovative sealing method may be employed for the entire photovoltaic device.

Figure 2:
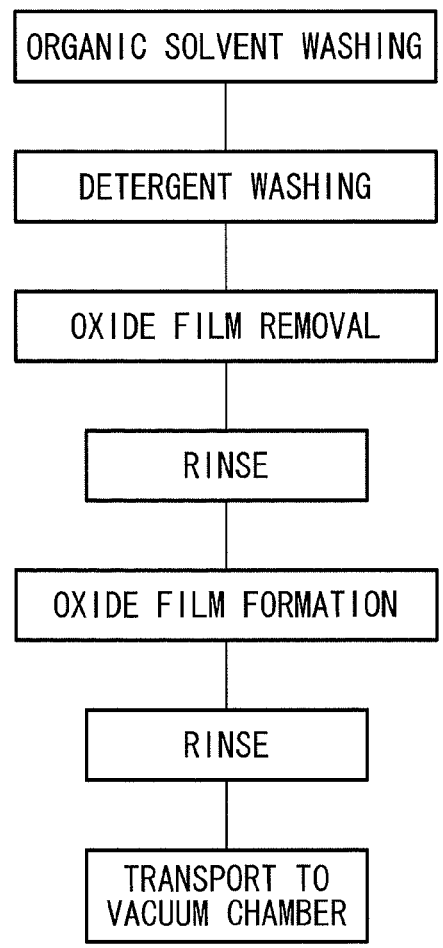
FIG. 2 is a flowchart describing a sequence of stages for washing a substrate.
Figure 3:
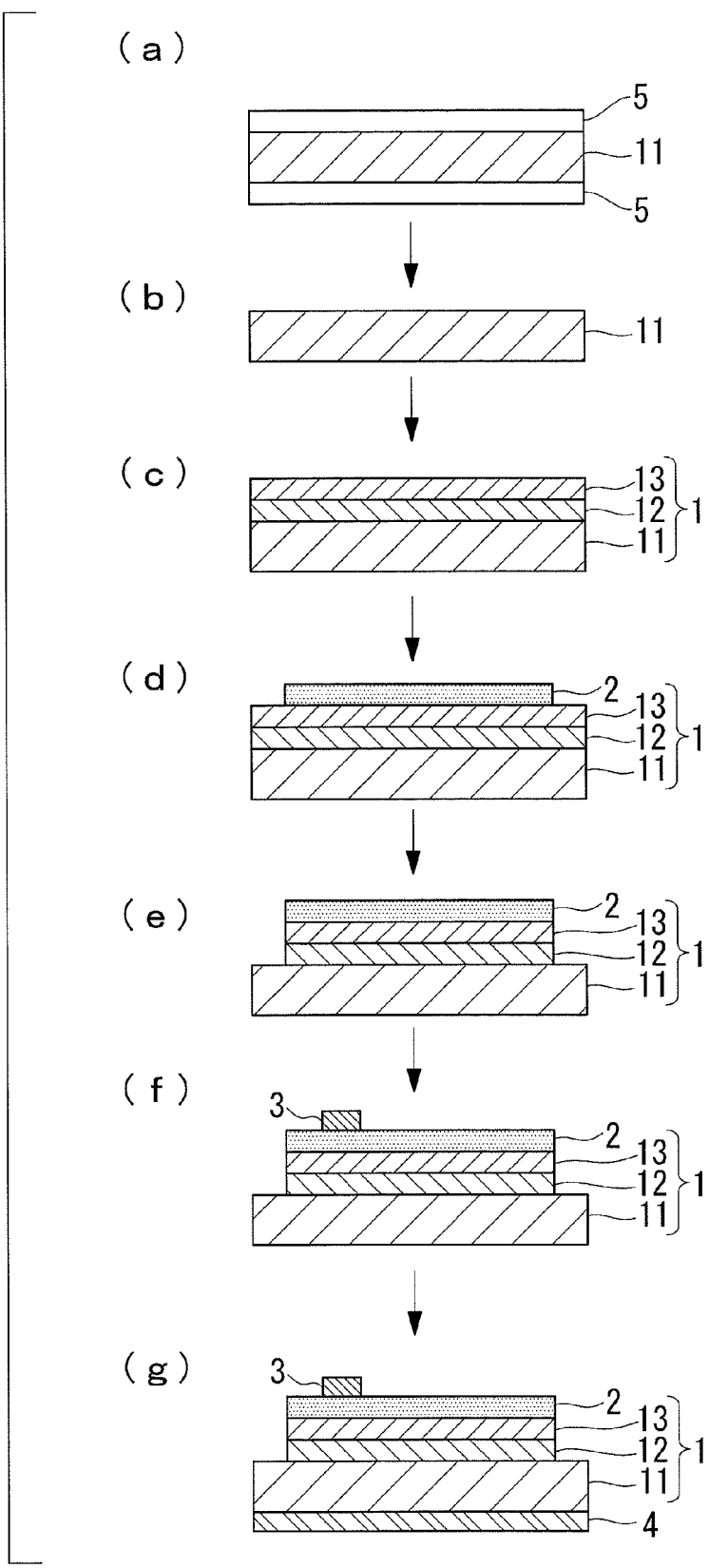
FIG. 3 shows a diagram describing a process for producing a solar cell following substrate washing.

A process for producing the photovoltaic device according to the first embodiment is described below. The process for producing a solar cell according to this embodiment comprises a substrate washing stage, an oxide film removal stage, a heterojunction cell preparation stage, an electrode formation stage, and an annealing treatment stage. FIG. 2 is a flowchart describing the sequence of stages within the substrate washing stage. FIG. 3 is a diagram describing the process for producing the solar cell following substrate washing.
(1) Substrate Washing Stage: FIG. 2

First, the substrate 11 is washed sequentially with an organic solvent such as acetone and then a detergent such as Semico Clean. Next, hydrogen fluoride (HF) is used to remove the oxide film formed on the surface of the substrate 11, and the substrate 11 is then rinsed with pure water (for one second). Subsequently, an oxide film 5 is formed on the surface of the substrate 11 using hydrogen peroxide ($H_2O_2$), and the substrate 11 is then again rinsed with pure water (for one second).
(2) Oxide Film Removal Stage: FIG. 3(a) and FIG. 3(b)

Following transport of the substrate 11 into a vacuum chamber, the oxide film 5 formed on the surface of the substrate 11 is removed. The conditions used for removing the oxide film are set appropriately in accordance with factors such as the type of heat source being used and the size of the substrate 11. For example, the inside of the vacuum chamber is evacuated to a pressure of approximately $10^{-7}$ Torr (133 µPa) or lower, and a heat source such as an infrared heater is then used to heat the substrate 11 for approximately 20 minutes. The temperature of the heat source may be raised to approximately 450° C. This causes sublimation of the oxide film (GeOx) formed on the surface of the substrate 11, enabling exposure of the washed surface of the substrate 11.

When an infrared heater was used, the heater temperature was raised to 450° C., and the actual substrate temperature was measured using a radiation thermometer, the actual substrate temperature was approximately 600° C.
(3) Heterojunction Cell Preparation Stage: FIG. 3(c)

The heterojunction cell preparation stage comprises a $PH_3$ exposure treatment stage, an i-layer deposition stage, and an n-layer deposition stage.
($PH_3$ Exposure Treatment Stage)

The substrate 11 from which the oxide film has been removed is adjusted to a prescribed temperature. The prescribed temperature in the present embodiment is set to the steady state for the substrate 11 (an actual substrate temperature of not more than 200° C.). The substrate 11 is cooled to the prescribed temperature following the removal of the oxide film.

Subsequently, the substrate 11 is placed in a separate vacuum chamber, and preferably in the deposition chamber for an n-type amorphous silicon layer (the n-layer deposition chamber) of a plasma-enhanced CVD apparatus. $PH_3$ gas that has been diluted with $H_2$ gas is introduced into the vacuum chamber, and the substrate 11 is heated using a heat source such as a sheathed heater.

The conditions for the $PH_3$ exposure (such as the amount of $PH_3$ introduced, the substrate temperature, the exposure time and the pressure) may be set as appropriate. For example, a 0.6% $PH_3$ gas diluted with $H_2$ gas may be introduced at 0.3 sccm/cm² and 0.1 Torr (13.3 Pa), and a heat source such as a sheathed heater used to heat the substrate 11 for 0.5 minutes to 10 minutes from room temperature to approximately 300° C. In order to enable the temperature from the deposition conditions within the n-layer deposition chamber to be used without alteration, the substrate temperature is preferably set to approximately 150° C.

The amount of introduced $PH_3$ gas may be extremely small. In terms of the substrate temperature during exposure, a higher temperature has the effect of improving the cell performance, but in order to prevent thermal decomposition of the $PH_3$ gas, the substrate temperature is preferably set to not more than 300° C.
(i-Layer Deposition Stage and n-Layer Deposition Stage)

Using a plasma-enhanced CVD apparatus, the i-type amorphous silicon layer 12 and the n-type amorphous silicon layer 13 are deposited sequentially on the substrate 11. The i-type amorphous silicon layer 12 is deposited in a deposition chamber for the i-type amorphous silicon layer (the i-layer deposition chamber), using $SiH_4$ gas and $H_2$ gas as the raw material gases, under a reduced pressure atmosphere of not less than 1 Pa and not more than 1,000 Pa, and at a substrate temperature of approximately 150° C.

The n-type amorphous silicon layer 13 is deposited in a deposition chamber for the n-type amorphous silicon layer (the n-layer deposition chamber), using $SiH_4$ gas, $H_2$ gas and $PH_3$ gas as the raw material gases, under a reduced pressure atmosphere of not less than 1 Pa and not more than 1,000 Pa, and at a substrate temperature of approximately 150° C.

(4) Electrode Formation Stage: FIG. 3(d) to FIG. 3(g)

The transparent electrode layer 2 is formed on top of the n-type amorphous silicon layer 13 using a radio-frequency (RF) sputtering method. The sputtering conditions include an ITO sintered compact as the target, an atmospheric gas of Ar, an ultimate pressure of $10^{-4}$ Pa to $10^{-5}$ Pa, and a high-frequency power of 2 $W/cm^2$ to 3 $W/cm^2$.

Subsequently, element isolation is performed by reactive ion etching (RIE).

A pattern mask plate is installed on top of the transparent electrode layer 2, and the grid electrode 3 is formed using a direct current (DC) sputtering method. The sputtering conditions include an Ag target, an atmospheric gas of Ar, an ultimate pressure of $10^{-4}$ Pa to $10^{-5}$ Pa, and a high-frequency power of 2 $W/cm^2$ to 3 $W/cm^2$.

The back electrode layer 4 is formed by resistance heating deposition on the back surface of the substrate 11 (the surface opposite the surface on which the amorphous silicon layers have been formed). Al is heated and vaporized by passing a current of 30 A through a tungsten filament.

(5) Annealing Treatment Stage: FIG. 3(g)

The solar cell prepared using the stages described above is subjected to an annealing treatment by heating in a vacuum. The annealing treatment is preferably performed at a substrate temperature of approximately 150° C. for 8 hours in order to avoid adverse effects such as the hydrogen desorption from hydrogen-terminated Si of the amorphous silicon layers.

In the $PH_3$ exposure treatment stage of the present embodiment, the prescribed temperature was set to the steady state for the substrate, but the prescribed temperature may also be set to a higher temperature than the steady state. Immediately following the oxide removal stage, the substrate 11 is at a high temperature, and therefore the substrate may simply be placed in the vacuum chamber used for the $PH_3$ exposure treatment before the substrate temperature has cooled below the prescribed temperature. This enables the process time to be shortened. Further, the substrate 11 that has been cooled to a steady state may also be re-heated with a heating source to increase the temperature to the prescribed temperature. Using these types of procedures means that a temperature adjustment device need not be provided in the vacuum chamber used for the $PH_3$ exposure treatment. Furthermore, the heater temperature within the n-layer deposition chamber may be used for the $PH_3$ exposure treatment, with the n-layer deposition conditions maintained.

Further, in those cases where the prescribed temperature during the $PH_3$ exposure treatment stage or the substrate temperature following heating is higher than the steady state of the substrate, the annealing treatment stage may be omitted.

Next is a description of the grounds for the condition settings used in the stages described above.

A solar cell (photovoltaic device cell) having the basic structure described below was prepared under a variety of conditions for the purposes of comparison. Those stages for which no particular description is provided were performed in the same manner as that described for the first embodiment.

Grid electrode: Ag film, average thickness 200 nm
Transparent electrode layer: ITO film, average thickness 70 nm
n-type amorphous silicon layer: average thickness 7 nm
i-type amorphous silicon layer: average thickness 5 nm
p-type monocrystalline Ge: average thickness 500 μm
Back electrode layer: Al film, average thickness 200 nm A p-type monocrystalline Ge having an orientation of Ge (100), a resistance of 0.028 Ωcm to 3.2 Ωcm, and a carrier density of $7.1 \times 10^{14}/cm^3$ to $2.6 \times 10^{17}/cm^3$ was used.

(Effects of $PH_3$ Exposure Treatment)

Conditions 1: ($PH_3$ exposure treatment+deposition of i-layer in i-layer deposition chamber)

The substrate was cooled to a temperature of not more than 200° C., and then placed in the n-layer deposition chamber. A 0.6% $PH_3$ gas diluted with $H_2$ gas was introduced into the vacuum chamber at 0.3 $sccm/cm^2$ and 0.1 Torr (13.3 Pa). The sheathed heater temperature was set to 200° C. so as to achieve a substrate temperature of approximately 150° C., and a $PH_3$ exposure treatment was performed for 5 minutes. Subsequently, the substrate was transported via a high-vacuum evacuated transport chamber into the i-layer deposition chamber, and an i-type amorphous silicon layer was deposited using a raw material gas composed of $SiH_4$ gas and $H_2$ gas (0.15 $sccm/cm^2$ and 0.45 $sccm/cm^2$), under conditions including a reduced pressure atmosphere of 0.1 Torr (13.3 Pa) and a substrate temperature of approximately 150° C. Next, the substrate was transferred to the n-layer deposition chamber, and an n-type amorphous silicon layer was deposited using a raw material gas composed of $SiH_4$ gas, $H_2$ gas and $PH_3$ gas, under conditions including a reduced pressure atmosphere of 0.1 Torr (13.3 Pa) and a substrate temperature of approximately 150° C.

Conditions 2: (No $PH_3$ exposure treatment+deposition of i-layer in i-layer deposition chamber)

With the exception of not performing the $PH_3$ exposure treatment, the i-type amorphous silicon layer and the n-type amorphous silicon layer were deposited in the same manner as that described for conditions 1.

Conditions 3: (No $PH_3$ exposure treatment+deposition of i-layer in n-layer deposition chamber)

With the exceptions of not performing the $PH_3$ exposure treatment, and depositing the i-type amorphous silicon layer in the n-layer deposition chamber, the i-type amorphous silicon layer and the n-type amorphous silicon layer were deposited in the same manner as that described for conditions 1.

Conditions 4: ($H_2$ plasma treatment+deposition of i-layer in i-layer deposition chamber)

With the exception of irradiating the surface of the substrate with a $H_2$ plasma for either 5 seconds or 30 seconds instead of performing the $PH_3$ exposure treatment, the i-type amorphous silicon layer and the n-type amorphous silicon layer were deposited in the same manner as that described for conditions 2.

Conditions 5: ($PH_3$ exposure treatment+$PH_3$ plasma treatment+deposition of i-layer in i-layer deposition chamber)

Following the $PH_3$ exposure treatment, the substrate surface was irradiated with a $PH_3$ plasma for 5 seconds, and the i-type amorphous silicon layer and the n-type amorphous silicon layer were then deposited in the same manner as that described for conditions 1. However, the thickness of the i-type amorphous silicon layer was altered to 40 nm.

Conditions 6: (No PH$_3$ exposure treatment+insertion of p-layer between substrate and i-layer)

Without performing the PH$_3$ exposure treatment, the substrate was placed in the n-layer deposition chamber of a plasma-enhanced CVD apparatus, and the plasma was ignited for 5 seconds to deposit an n-type amorphous silicon layer with a thickness of 1 nm on the substrate. The i-type amorphous silicon layer and a separate n-type amorphous silicon layer were then deposited on top of the n-type amorphous silicon layer in the same manner as that described for conditions 1. However, the thickness of the i-type amorphous silicon layer was altered to 40 nm.

Figure 4:
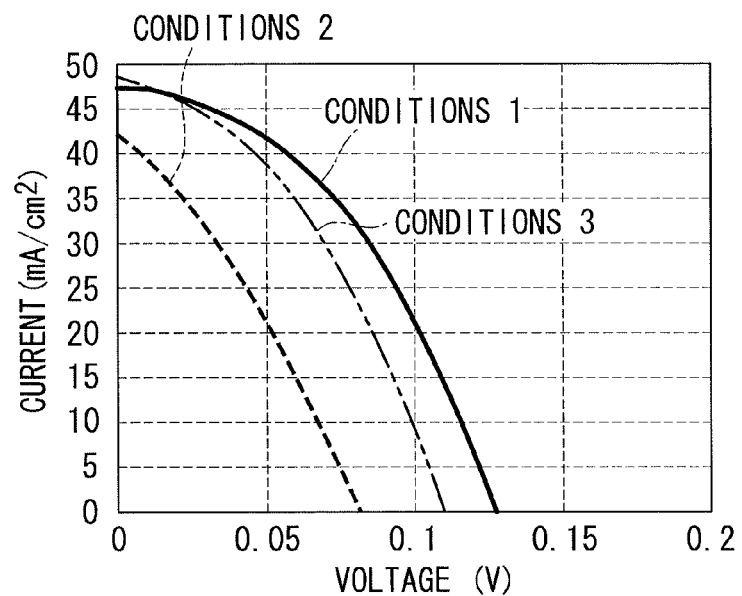
FIG. 4 shows a diagram illustrating the power generation characteristics of a solar cell.

The power generation characteristics of the solar cells prepared under the aforementioned conditions 1 to conditions 3 were evaluated. The results are illustrated in FIG. 4. In this figure, the horizontal axis represents the voltage and the vertical axis represents the current.

According to FIG. 4, the conversion efficiency for the solar cells prepared under conditions 1 to conditions 3 was 2.59%, 1.08% and 2.12% respectively. The conditions 1 (PH$_3$ exposure treatment+deposition of i-layer in i-layer deposition chamber) yielded an approximately 2.5-fold increase in the conversion efficiency of the solar cell compared with conditions 2 (no PH$_3$ exposure treatment+deposition of i-layer in i-layer deposition chamber). This result confirmed that by exposing the substrate surface to PH$_3$ prior to deposition of the i-type amorphous silicon layer, the conversion efficiency of the solar cell could be improved. Further, compared with the solar cell prepared under conditions 2, the solar cell prepared under conditions 1 exhibited a 57% increase in the open circuit voltage, a 12% increase in the short-circuit current density, a 36% increase in the fill factor, and a 139% improvement in the power generation efficiency.

Further, compared with conditions 2 (no PH$_3$ exposure treatment+deposition of i-layer in i-layer deposition chamber), the conditions 3 (no PH$_3$ exposure treatment+deposition of i-layer in n-layer deposition chamber) also exhibited an improvement in the conversion efficiency. During deposition of the n-type amorphous silicon layer, PH$_3$ gas is introduced into the n-layer deposition chamber. Accordingly, although no PH$_3$ exposure treatment is performed under conditions 3, it is surmised that residual PH$_3$ on the surfaces of the walls and the like inside the n-layer deposition chamber is transported to the vicinity of the substrate by the hydrogen gas, yielding similar effects to those observed for the PH$_3$ exposure treatment.

Based on the above results, it is inferred that even the existence of a very small amount of PH$_3$ has an effect in controlling the interface band structure.

The power generation characteristics of the solar cells prepared under the aforementioned conditions 4 to conditions 6 were also evaluated.

It is known that when an H$_2$ plasma is irradiated onto the surface of a Si substrate, a surface passivation effect and a surface cleaning effect can be expected. However, the solar cell prepared under conditions 4 (H$_2$ plasma treatment+deposition of i-layer in i-layer deposition chamber) exhibited inferior power generation characteristics to the solar cell prepared under conditions 2 (no PH$_3$ exposure treatment+deposition of i-layer in i-layer deposition chamber). It is thought that this is because deterioration in the surface characteristics of the p-type monocrystalline Ge that has been subjected to H$_2$ plasma treatment, causing the shunt resistance decrease. Further, when a solar cell was irradiated with a H$_2$ plasma for 30 seconds for comparison, the power generation characteristics of the resulting solar cell were inferior to even those of the solar cell that was irradiated with a H$_2$ plasma for 5 seconds. It is thought that these results show that H$_2$ plasma irradiation causes damage to the surface of the p-type monocrystalline Ge.

In the solar cell prepared under conditions 5, it was anticipated that by irradiating the substrate with a PH$_3$ plasma following the PH$_3$ exposure treatment, energy would be supplied to the substrate surface, yielding a similar effect to an increase in the substrate temperature, but the shunt resistance decreased and the power generation characteristics deteriorated in a similar manner to that observed under conditions 4. These results indicated that when a PH$_3$ plasma is irradiated onto the surface of a p-type monocrystalline Ge, the effect of the damage caused by the plasma is greater than the improvement effect on the interface properties caused by the PH$_3$ gas.

The solar cell prepared under conditions 6 had low shunt resistance, the conversion efficiency fell to less than 1%, and the power generation characteristics were poor. Based on these results, it was evident that even if the p-type monocrystalline Ge/i-type amorphous silicon layer interface was changed to n-layer, the power generation characteristics could not be improved. Further, the above results infer that it is important to improve the surface quality of the p-type monocrystalline Ge, which is assumed to be in p-type when the surface oxide film is removed.

Based on the above results, it can be stated that in the surface treatment of p-type monocrystalline Ge, it is important that P (PH$_3$) exists at the interface, even if in a very small amount. Further, it was also evident that treatments such as H$_2$ plasma that damage the surface of the p-type monocrystalline Ge are unsuitable as p-type monocrystalline Ge surface treatments for improving the power generation characteristics.

(Confirmation of Change in Interface Band Structure Upon PH$_3$ Exposure Treatment)

Solar cells in which the thickness of the i-type amorphous silicon layer was either 40 nm or 80 nm were prepared under the aforementioned conditions 1 and conditions 2, and under conditions 7 described below.

Conditions 7: (B$_2$H$_6$ exposure treatment+deposition of i-layer in i-layer deposition chamber)

With the exception of introducing a 0.1% B$_2$H$_6$ gas diluted with H$_2$ into the i-layer deposition chamber instead of performing the PH$_3$ exposure treatment, an i-type amorphous silicon layer and an n-type amorphous silicon layer were deposited in the same manner as that described for conditions 1.

Figure 5:
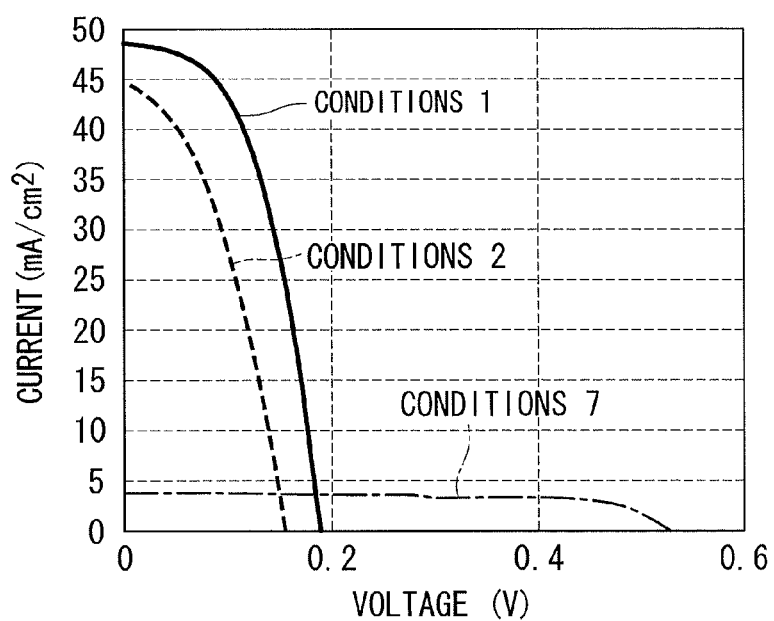
FIG. 5 shows a diagram illustrating the power generation characteristics of a solar cell.

The power generation characteristics of solar cells in which the i-type amorphous silicon layer (thickness: 40 nm) was deposited under the aforementioned conditions 1, conditions 2 and conditions 7 were evaluated. The results are illustrated in FIG. 5. In this figure, the horizontal axis represents the voltage and the vertical axis represents the current.

As illustrated in FIG. 5, even when the thickness of the i-type amorphous silicon layer was increased (from 5 nm to 40 nm), conditions 1 (PH$_3$ exposure treatment+deposition of i-layer in i-layer deposition chamber) yielded an increase in the conversion efficiency of the solar cell compared with conditions 2 (no PH$_3$ exposure treatment+deposition of i-layer in i-layer deposition chamber). Further, in the solar cell prepared under conditions 7 (B$_2$H$_6$ exposure treatment+ deposition of i-layer in i-layer deposition chamber), the power generation characteristics were lower than those observed under either conditions 1 or conditions 2. This is because exposing the p-type monocrystalline Ge to B$_2$H$_6$ makes it more difficult to extract the current generated by the p-type monocrystalline Ge. Further, the low extracted current is also due to the fact that only the i-type amorphous silicon layer functions as a power generation layer.

Figure 6:
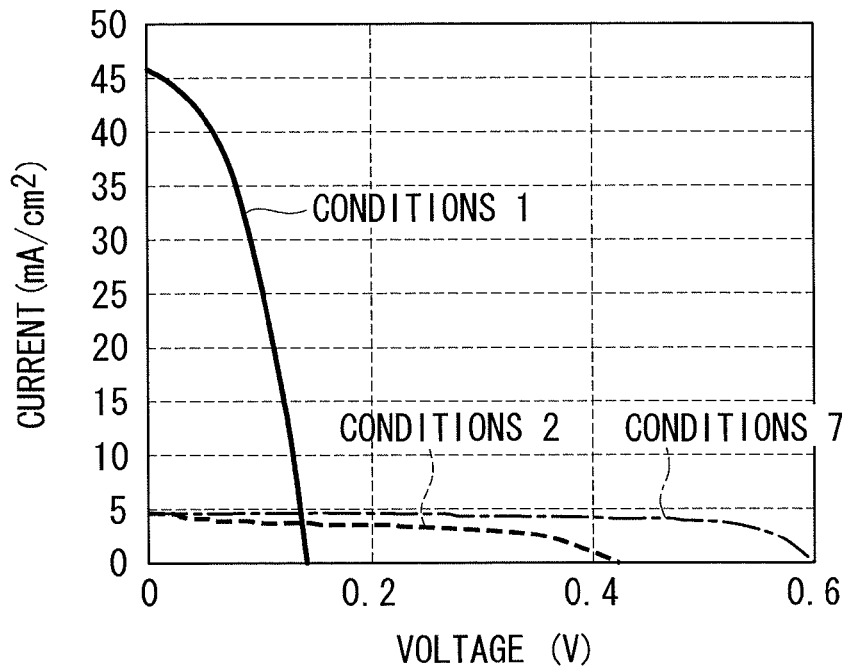
FIG. 6 shows a diagram illustrating the power generation characteristics of a solar cell.

The power generation characteristics of solar cells in which the i-type amorphous silicon layer (thickness: 80 nm) was deposited under the aforementioned conditions 1, conditions 2 and conditions 7 were evaluated. The results are illustrated in FIG. 6. In this figure, the horizontal axis represents the voltage and the vertical axis represents the current.

As illustrated in FIG. 6, when the thickness of the i-type amorphous silicon layer was further increased (from 40 nm to 80 nm), the solar cell prepared under conditions 2 (no $PH_3$ exposure treatment+deposition of i-layer in i-layer deposition chamber) also transitioned to a state in which it became difficult to extract the current generated by the p-type monocrystalline Ge. It is surmised that this result indicates that the current has become difficult to be extracted due to a conduction band barrier caused by a band discontinuity that exists at the interface between the p-type monocrystalline Ge and the i-type amorphous silicon layer, and that the $PH_3$ gas and $B_2H_6$ gas are dopants thus affecting the conduction type at the interface.

Following the oxide removal stage, it is thought that the surface of the p-type monocrystalline Ge (substrate) is further p-type. $B_2H_6$ has the effect of making the interface more p-type, and therefore the bending of the band at the interface of the p-type monocrystalline Ge functions as a barrier to electrons, and because the electrons cannot cross the conduction band barrier, current cannot be extracted.

On the other hand, $PH_3$ has the effect of making the interface more n-type, and it is therefore assumed that the surface of the p-type monocrystalline Ge is moderated, enabling a current to be extracted.

Figure 7:
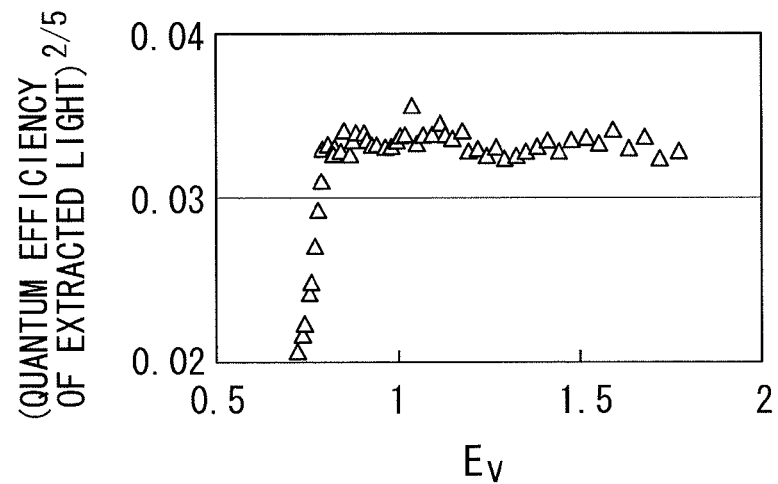
FIG. 7 shows a diagram illustrating measurement results from an internal photoemission (IPE) method.
Figure 8:
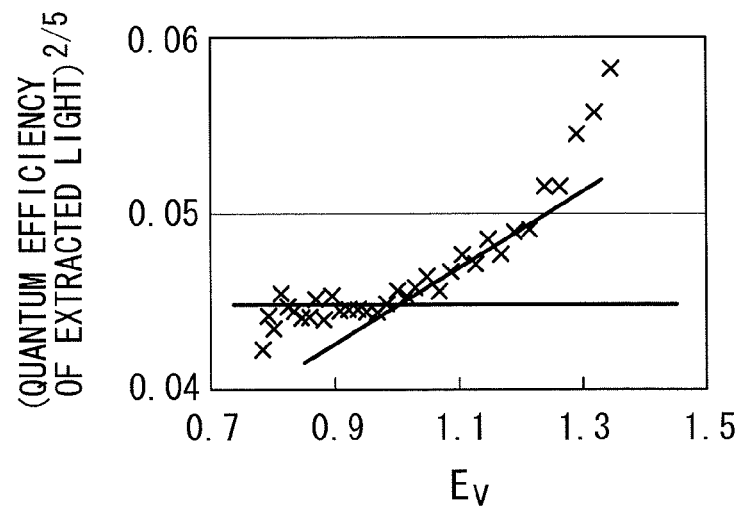
FIG. 8 shows a diagram illustrating measurement results from an internal photoemission (IPE) method.
Figure 9:
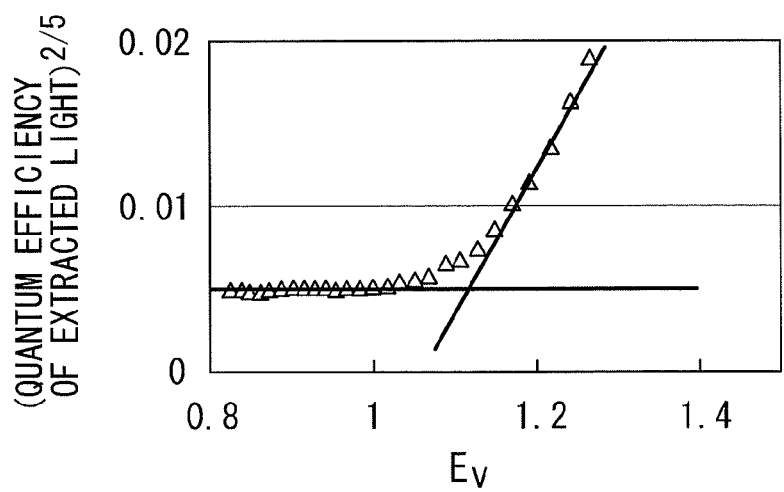
FIG. 9 shows a diagram illustrating measurement results from an internal photoemission (IPE) method.

Solar cells in which the i-type amorphous silicon layer (thickness: 80 nm) was deposited under the aforementioned conditions 1, conditions 2 and conditions 7 were measured using an internal photoemission (IPE) method. IPE is a technique that utilizes the fact that when a carrier obtains enough optical energy to exceed the band discontinuity energy, the carrier can be extracted externally as a current, and can determine the height of the barrier on the basis of the wavelength dependency of the obtained current. In other words, because measurement is performed by applying a forward bias and eliminating the effect of carrier acceleration caused by the depletion layer, the existence of a threshold can be clarified. The results are illustrated in FIG. 7 to FIG. 9. FIG. 7, FIG. 8 and FIG. 9 illustrate the measurement results using the solar cells prepared under the conditions 1, conditions 2 and conditions 7 respectively. In each of FIG. 7 to FIG. 9, the horizontal axis represents the amount of energy, and the vertical axis represents (quantum efficiency of extracted light of extracted light)$^{2/5}$.

In FIG. 8 and FIG. 9, a threshold thought to be due to the conduction band barrier was observed, but in FIG. 7, no such threshold was observed. Further, comparison of FIG. 8 (conditions 2) and FIG. 9 (conditions 7) reveals that the threshold was higher in the $B_2H_6$-treated solar cell (conditions 7). Based on these results, it is assumed that performing a $B_2H_6$ exposure treatment promotes the p-type conversion of the surface of the p-type monocrystalline Ge.

The above results confirm that by subjecting a p-type monocrystalline Ge (substrate) to a $PH_3$ exposure treatment, the surface of the p-type monocrystalline Ge can be moderated, enabling the power generation characteristics of the solar cell to be improved.

($PH_3$ Exposure Treatment Conditions)

Solar cells of the structure described below were produced under various changed conditions (the substrate temperature, the exposure time and the pressure) during the $PH_3$ exposure treatment. Stages for which no description is provided were conducted in the same manner as that described for the first embodiment.

Grid electrode: Ag film, average thickness 200 nm
Transparent electrode layer: ITO film, average thickness 70 nm
n-type amorphous silicon layer: average thickness 7 nm
i-type amorphous silicon layer: average thickness 40 nm
p-type monocrystalline Ge layer: average thickness 175 μm
Back electrode layer: Al film, average thickness 200 nm Substrate Temperature:

The substrate temperature in the $PH_3$ exposure treatment stage of the conditions 1 was set to 50° C., 150° C., or 220° C.

The power generation characteristics of the thus prepared solar cells were evaluated. The results are shown in Table 1. In Table 1, the results are shown relative to a standard value (1.0) for the power generation characteristics of the solar cell subjected to the $PH_3$ exposure treatment at a substrate temperature of 150° C.

TABLE 1

| | Substrate temperature (° C.) | | |
| --- | --- | --- | --- |
| | 50 | 150 | 220 |
| Voc | 0.96 | 1.0 | 1.14 |
| Jsc | 1.02 | 1.0 | 1.03 |
| FF | 0.94 | 1.0 | 1.05 |

Table 1 reveals that as the substrate temperature was increased, the open-circuit voltage (Voc) and the fill factor (FF) increased, with the power generation characteristics being greatest when the substrate temperature was set to 220° C. On the other hand, the short-circuit current (Jsc) was lowest for the solar cell in which the $PH_3$ exposure treatment was performed at 150° C., but this observation is thought to be due to differences in the quality of the ITO film. Differences in the ITO film quality occur as a result of differences in the state of the deposition apparatus during deposition. Specifically, a difference occurs in the absorption coefficient of the ITO film when a change occurs in the state of the deposition apparatus, and because the type of difference observed in Table 1 (of approximately 2 to 3%) can occur due to spectral sensitivity characteristics determined by calculations that take due consideration of the cell reflectance and the ITO film absorption coefficient, minor differences in the short-circuit current (Jsc) cannot be subjected to comparative evaluation.

Accordingly, by setting the substrate temperature during the $PH_3$ exposure treatment stage to not less than 150° C., a dramatic improvement can be obtained in the power generation characteristics of the solar cell.

Exposure Time:

The $PH_3$ exposure time in the $PH_3$ exposure treatment stage of the conditions 1 was set to 0.5 minutes, 5 minutes, or 10 minutes.

With the substrate temperature during the $PH_3$ exposure treatment stage set to 150° C., the power generation characteristics of the thus prepared solar cells were evaluated. The results are shown in Table 2. In Table 2, the results are shown relative to a standard value (1.0) for the power generation characteristics of the solar cell prepared using an exposure time of 5 minutes.

TABLE 2

| | Exposure time (minutes) | | |
|---|---|---|---|
| | 0.5 | 5 | 10 |
| Voc | 0.98 | 1.0 | 1.02 |
| Jsc | 1.03 | 1.0 | 1.02 |
| FF | 0.98 | 1.0 | 0.97 |

Table 2 reveals that even when the reaction time of the $PH_3$ exposure treatment stage was changed, almost no difference was observed in the power generation characteristics of the solar cell.

Pressure:

The pressure at the time of $PH_3$ introduction in the $PH_3$ exposure treatment stage of the conditions 1 was set to 1.33 Pa, 13.3 Pa, or 133 Pa. The power generation characteristics of the thus prepared solar cells were evaluated. Changing the pressure had no effect on the cell performance.

(Effects of Annealing Treatment Stage)

Figure 10:
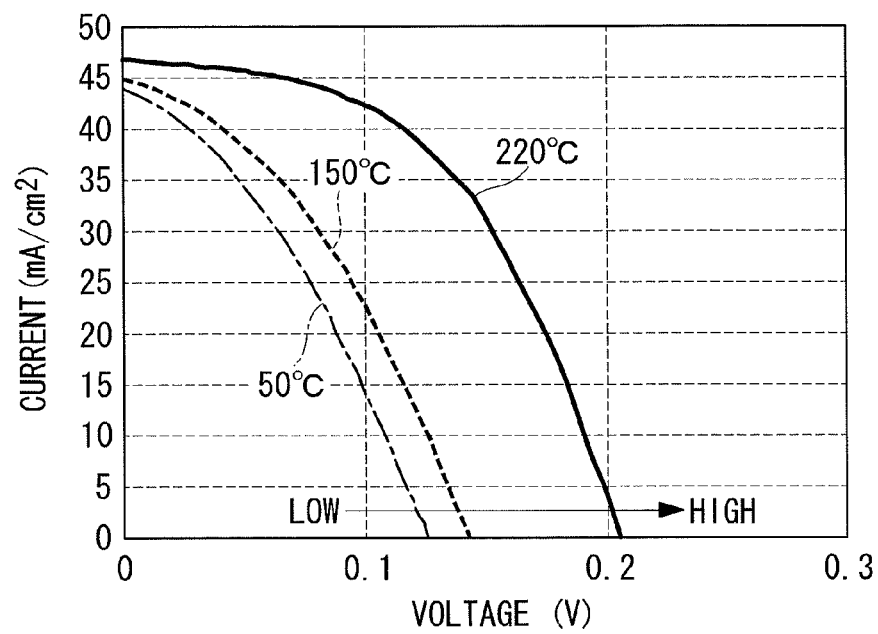
FIG. 10 shows a diagram illustrating the power generation characteristics of a solar cell.
Figure 11:
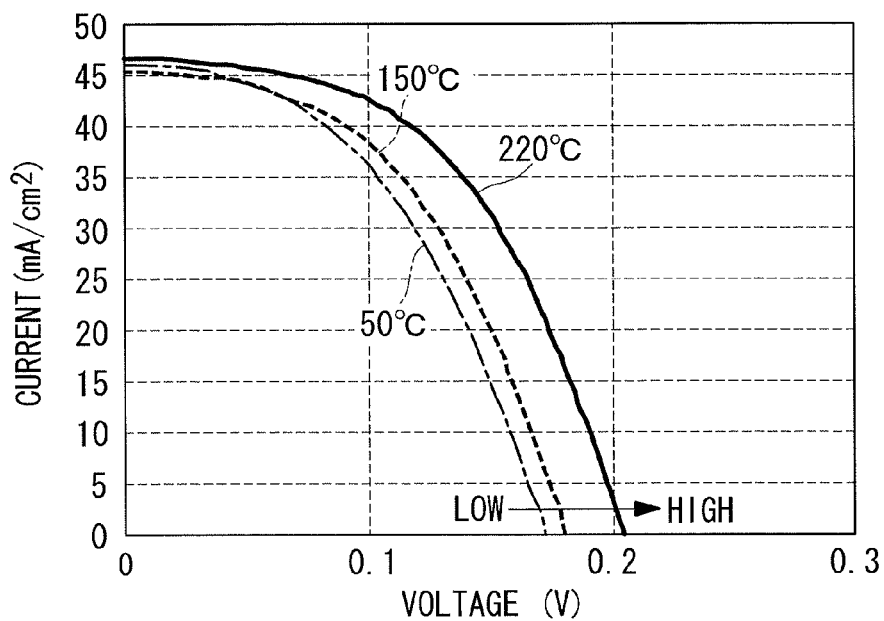
FIG. 11 shows a diagram illustrating the power generation characteristics of a solar cell.

In a similar manner to that described above (for the $PH_3$ exposure treatment conditions), solar cells were produced under various changed values for the substrate temperature during the $PH_3$ exposure treatment stage, and the power generation characteristics of the resulting solar cells were evaluated before and after an annealing treatment stage (a heating treatment in a vacuum with the substrate temperature held at approximately 150° C. for 8 hours). The results are shown in FIG. 10 and FIG. 11. FIG. 10 illustrates the power generation characteristics of the solar cell before the annealing treatment, and FIG. 11 illustrates the results after the annealing treatment. In these figures, the horizontal axis represents the voltage, and the vertical axis represents the current.

As illustrated in FIG. 10 and FIG. 11, regardless of whether or not the annealing treatment stage was performed, the power generation characteristics improved with a higher substrate temperature during the $PH_3$ exposure treatment stage. Further, using the power generation characteristics when the substrate temperature was 150° C. as a standard, the power generation characteristics of the solar cells that had undergone the annealing treatment exhibited a smaller difference from the standard compared with the solar cells that had not undergone the annealing treatment.

The above results indicate that the reaction between the Ge interface and the $PH_3$ can be effective even following formation of the solar cell, by performing an annealing treatment, and that by including an annealing treatment stage after the electrode formation stage, the power generation characteristics of the solar cell can be improved. Including an annealing treatment stage is particularly effective when, for process-related reasons, the substrate temperature is lowered for the $PH_3$ exposure treatment.

Further, comparison of FIG. 10 and FIG. 11 reveals that when the substrate temperature during the $PH_3$ exposure treatment was high, no difference was observed in the cell performance between before and after the annealing treatment stage. The above results show that when the $PH_3$ exposure treatment is performed at a high substrate temperature, the annealing treatment stage can be omitted.

Furthermore, it is thought that a higher substrate temperature is preferable in order to maximize the effect of the annealing treatment, but if due consideration is given to the effect on the amorphous silicon layers, then the heating that is performed during the annealing treatment stage, which is performed after the stacking of the amorphous silicon layers, cannot be conducted at a temperature exceeding 200° C. Accordingly, it is preferable that treatments involving the application of heat are completed before the deposition of the amorphous silicon layers, namely in the state where the structure includes only structurally stable crystalline material.

Next, in a similar manner to that described above (for the $PH_3$ exposure treatment conditions), solar cells were produced under various changed values for the exposure time, and the power generation characteristics of the resulting solar cells were evaluated before and after the annealing treatment stage. With the substrate temperature during the $PH_3$ exposure treatment stage set to 150° C., the results of evaluating the power generation characteristics are shown in Table 3 and Table 4. Table 3 shows the power generation characteristics of the solar cell before the annealing treatment, and Table 4 shows the results after the annealing treatment. The results in Table 3 and Table 4 are shown relative to a standard value (1.0) for the power generation characteristics of the solar cell produced using an exposure time of 5 minutes.

Table 4 is the same as the above Table 2, but is included a second time to facilitate comparison of the results obtained with and without the annealing treatment stage.

TABLE 3

| | Exposure time (minutes) | | |
|---|---|---|---|
| | 0.5 | 5 | 10 |
| Voc | 0.88 | 1.0 | 1.01 |
| Jsc | 1.01 | 1.0 | 1.02 |
| FF | 0.97 | 1.0 | 1.06 |

TABLE 4

| | Exposure time (minutes) | | |
|---|---|---|---|
| | 0.5 | 5 | 10 |
| Voc | 0.98 | 1.0 | 1.02 |
| Jsc | 1.03 | 1.0 | 1.02 |
| FF | 0.98 | 1.0 | 0.97 |

Table 3 reveals that for those solar cells in which the annealing treatment was not performed, the power generation characteristics were inferior for the solar cell produced using an exposure time of 0.5 minutes. When a gas is introduced into the vacuum chamber, it is assumed that heat conduction from the heater increases, causing an increase in the substrate temperature, but it is thought that when the exposure time is 0.5 minutes, a satisfactory effect cannot be achieved. On the other hand, Table 4 reveals that for those solar cells in which the annealing treatment was performed, almost no difference was observed in the power generation characteristics even when the exposure time was varied. These results confirmed that when an annealing treatment stage is included, the time for which the substrate is exposed to $PH_3$ can be set as appropriate.

Next, in a similar manner to that described above (for the $PH_3$ exposure treatment conditions), solar cells were produced under various changed values for the pressure at the time of $PH_3$ gas introduction, and the power generation characteristics of the resulting solar cells were evaluated before and after the annealing treatment stage.

The power generation characteristics of the solar cells in which the annealing treatment was not performed were greatest at a pressure of 133 Pa, and lowest at a pressure of 1.33 Pa.

It is thought that this is because a higher pressure enables the substrate temperature to reach a higher value. In contrast, for the solar cells in which the annealing treatment was performed, almost no difference was observed in the power generation characteristics even when the pressure was varied. These results confirmed that when an annealing treatment stage is included, the pressure at the time when the $PH_3$ gas is introduced to the substrate can be set as appropriate.

Based on the above results, it is evident that from the viewpoint of increasing the substrate temperature during the $PH_3$ exposure treatment, the exposure time for the $PH_3$ exposure treatment stage is preferably long, and the pressure during the $PH_3$ exposure treatment is preferably high in order to increase heat conduction.

(Substrate Reheating During $PH_3$ Exposure Treatment Stage)

With the exception of altering the $PH_3$ exposure treatment stage, solar cells of the structure described below were produced in accordance with the first embodiment.

Grid electrode: Ag film, average thickness 200 nm
Transparent electrode layer: ITO film, average thickness 70 nm
n-type amorphous silicon layer: average thickness 7 nm
i-type amorphous silicon layer: average thickness 40 nm
p-type monocrystalline Ge: average thickness 175 μm
Back electrode layer: Al film, average thickness 200 nm With Substrate Reheating:

Following the oxide film removal stage, the substrate was initially cooled to a temperature of not more than 200° C., and an infrared heater was then used to reheat the substrate to a prescribed temperature (approximately 250° C.). Subsequently, the substrate was placed in the n-layer deposition chamber of a plasma-enhanced CVD apparatus.

Next, a 0.6% $PH_3$ gas diluted with $H_2$ gas was introduced into the vacuum chamber at 0.3 sccm/cm² and 0.1 Torr (13.3 Pa), the sheathed heater temperature was set to 200° C., and the substrate was exposed to the $PH_3$ gas for 5 minutes.

Subsequently, the substrate was transferred to the i-layer deposition chamber, and an i-type amorphous silicon layer was deposited using a raw material gas composed of $SiH_4$ gas and $H_2$ gas (0.15 sccm/cm²/0.45 sccm/cm²), under conditions including a reduced pressure atmosphere of 0.1 Torr (13.3 Pa) and a substrate temperature of approximately 150° C.

The substrate was then transferred to the n-layer deposition chamber, and deposition was performed using a raw material gas composed of $SiH_4$ gas, $H_2$ gas and $PH_3$ gas, under conditions including a reduced pressure atmosphere of 0.1 Torr (13.3 Pa) and a substrate temperature of approximately 150° C.

Without Substrate Reheating:

Following the oxide film removal, the substrate was cooled to a temperature of not more than 200° C., and was then placed inside the n-layer deposition chamber of the plasma-enhanced CVD apparatus without performing substrate reheating. A solar cell was then prepared in the same manner as that described for the solar cell in which substrate reheating was performed.

Figure 12:
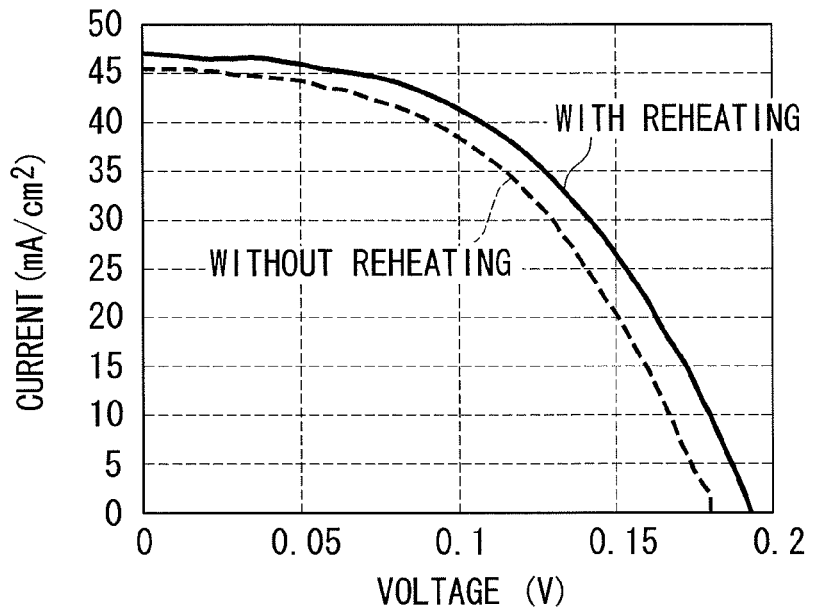
FIG. 12 shows a diagram illustrating the power generation characteristics of a solar cell.

The power generation characteristics of the solar cells prepared with substrate reheating and without substrate reheating were evaluated. The results are shown in FIG. 12. In this figure, the horizontal axis represents the voltage, and the vertical axis represents the current.

As illustrated in FIG. 12, although the temperature of the heat source (sheathed heater) during $PH_3$ exposure was 200° C. in both cases, the solar cell in which the substrate was reheated to the prescribed temperature before $PH_3$ exposure was performed exhibited improved power generation characteristics compared with the solar cell in which reheating was not performed.

On the other hand, because the characteristics improved when the $PH_3$ exposure treatment was performed after reheating the Ge substrate to a temperature of approximately 250° C., it is more effective to utilize the high temperature from the process prior to the exposure treatment. In other words, because the Ge substrate is at a high temperature immediately following the surface oxide film removal, performing the $PH_3$ exposure treatment before the substrate temperature cools enables the process time to be shortened.

(Thickness of p-Type Monocrystalline Ge)

With the exception of altering the thickness of the p-type monocrystalline Ge, solar cells of the structure described below were produced in accordance with the first embodiment.

Figure 13:
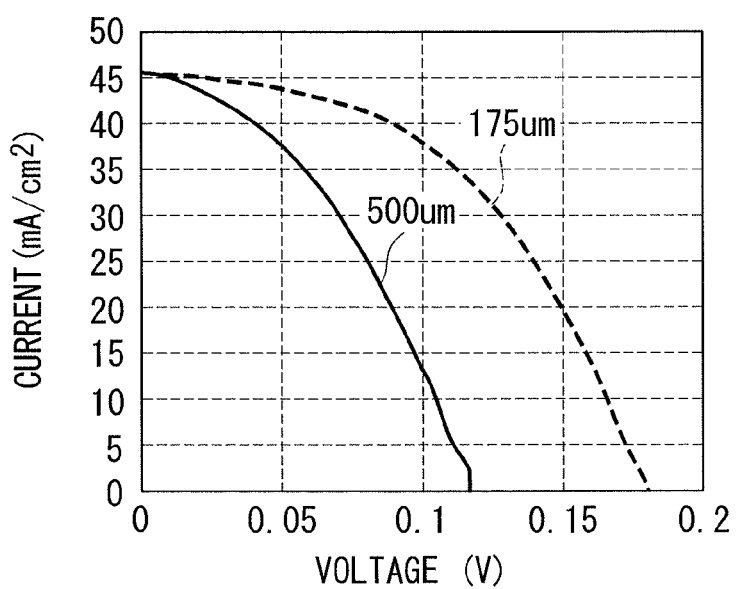
FIG. 13 shows a diagram illustrating the power generation characteristics of a solar cell.

Grid electrode: Ag film, average thickness 200 nm
Transparent electrode layer: ITO film, average thickness 70 nm
n-type amorphous silicon layer: average thickness 7 nm
i-type amorphous silicon layer: average thickness 40 nm
p-type monocrystalline Ge: average thickness 500 μm or 175 μm
Back electrode layer: Al film, average thickness 200 nm The power generation characteristics of the thus prepared solar cells were evaluated. The results are shown in FIG. 13. In this figure, the horizontal axis represents the voltage, and the vertical axis represents the current.

As illustrated in FIG. 13, reducing the thickness of the p-type monocrystalline Ge increased the open-circuit voltage by 53%. Based on these results, it is surmised that the surface recombination rate of the p-type monocrystalline Ge is reduced by the $PH_3$ exposure treatment, meaning a further reduction in the substrate thickness can be expected to yield a greater improvement in the open-circuit voltage. Considering the balance with light absorption, provided the length the light passes through the p-type monocrystalline Ge is approximately 5 μm, then light up to a wavelength of approximately 1,500 nm, which represents the wavelengths for which Ge exhibits a high absorption coefficient, can be absorbed satisfactorily. Here, "the length the light passes through the p-type monocrystalline Ge" is different from the thickness of the p-type monocrystalline Ge. Accordingly, by also taking into consideration reflection and scattering at the back surface, the thickness of the p-type monocrystalline Ge can actually be reduced to approximately 1.5 μm. Further, if the thickness of the p-type monocrystalline Ge is increased to 200 μm, then satisfactory absorption can be achieved for light up to a wavelength of approximately 1,600 nm. On the other hand, if the thickness of the p-type crystalline Ge is increased beyond 200 μm, then absorption is possible for light of wavelengths up to near the band edge, although the thickness is preferably not more than 500 μm in order to achieve a practically applicable thickness that is able to maintain the strength of the substrate during handling, while suppressing any temperature difference through the thickness direction of the substrate. However, for a substrate having a resistivity of not more than approximately 0.5 Ωcm used in a practical photovoltaic device, because free carrier absorption exists in the wavelength region near the band edge, even if light having a wavelength near the band edge is absorbed, no significant increase in the current density is observed, and therefore in order to avoid increasing the substrate thickness unnecessarily, the thickness is preferably not more than 200 μm. Accordingly, the thickness of the p-type monocrystalline Ge is preferably not less than 1.5 μm and not more than 500 μm, and is more preferably not more than 200 μm in order to achieve a better balance between the current and the voltage.

Based on the above results, it is evident that when the thickness of the p-type monocrystalline Ge is reduced, the open-circuit voltage improvement effect is greater than the increase in the fill factor caused by the reduction in series resistance.

Second Embodiment

With the exception of also including an electron beam irradiation stage, a process for producing a photovoltaic device according to this embodiment comprises the same stages as the first embodiment.

{Electron Beam Irradiation Stage)

An electron beam is irradiated onto the substrate surface during at least one period before or after the $PH_3$ exposure treatment stage. The electron beam irradiation conditions may be set as appropriate. The electron beam irradiation may be performed, for example, by Auger Electron Spectroscopy (AES), using a similar technique to the measurement system used for surface analysis (accelerating voltage: 2 kV, electron current: 50 μA).

When an electron beam irradiation stage is included, the substrate temperature during the $PH_3$ exposure in the $PH_3$ exposure treatment stage may be set to a low temperature (for example, 100° C.). Further, depending on the electron beam irradiation conditions and the $PH_3$ exposure conditions, the annealing treatment stage may be omitted.

A solar cell of the structure described below was produced in accordance with the second embodiment.

Grid electrode: Ag film, average thickness 200 nm
Transparent electrode layer: ITO film, average thickness 70 nm
n-type amorphous silicon layer: average thickness 7 nm
i-type amorphous silicon layer: average thickness 40 nm
p-type monocrystalline Ge: average thickness 500 μm
Back electrode layer: Al film, average thickness 200 nm A p-type monocrystalline Ge having an orientation of Ge (100), a resistance of 0.028 Ωcm to 3.2 Ωcm, and a carrier density of $7.1\times10^{14}/cm^3$ to $2.6\times10^{17}/cm^3$ was used.

Conditions 8: (Electron beam irradiation+$PH_3$ exposure treatment)

Following removal of the oxide film, the substrate was cooled to a temperature of not more than 200° C., and was then placed in the vacuum chamber of an AES apparatus. Following irradiation of the substrate surface with an electron beam at an accelerating voltage of 2 kV and an electron current of 50 μA, the substrate was transferred to the n-layer deposition chamber of a plasma-enhanced CVD apparatus. Next, a 0.6% $PH_3$ gas diluted with $H_2$ gas was introduced into the n-layer deposition chamber at 0.3 sccm/cm² and 0.1 Torr (13.3 Pa). The sheathed heater temperature was set so as to achieve a substrate temperature of approximately 150° C., and a $PH_3$ exposure treatment was performed for 5 minutes. Subsequently, the substrate was transferred to the i-layer deposition chamber of the plasma-enhanced CVD apparatus, and an i-type amorphous silicon layer was deposited using a raw material gas composed of $SiH_4$ gas and $H_2$ gas (0.15 sccm/cm² and 0.45 sccm/cm²), under conditions including a reduced pressure atmosphere of 0.1 Torr (13.3 Pa) and a substrate temperature of approximately 150° C. The substrate was then transferred to the n-layer deposition chamber, and an n-type amorphous silicon layer was deposited using a raw material gas composed of $SiH_4$ gas, $H_2$ gas and $PH_3$ gas, under conditions including a reduced pressure atmosphere of 0.1 Torr (13.3 Pa) and a substrate temperature of approximately 150° C.

Conditions 9: ($PH_3$ exposure treatment+electron beam irradiation)

Following removal of the oxide film, the substrate was cooled to a temperature of not more than 200° C., and was then placed in the n-layer deposition chamber of a plasma-enhanced CVD apparatus. A 0.6% $PH_3$ gas diluted with $H_2$ gas was introduced into the n-layer deposition chamber at 0.3 sccm/cm² and 0.1 Torr (13.3 Pa). The sheathed heater temperature was set so as to achieve a substrate temperature of approximately 150° C., and a $PH_3$ exposure treatment was performed for 5 minutes. Subsequently, the substrate was transferred to the vacuum chamber of an AES apparatus. Following irradiation of the substrate surface with an electron beam at an accelerating voltage of 2 kV and an electron current of 50 μA, the substrate was transferred to the i-layer deposition chamber of the plasma-enhanced CVD apparatus, and subsequent operations were performed in the same manner as the conditions 8 to deposit an i-type amorphous silicon layer and an n-type amorphous silicon layer.

Conditions 10: (Electron beam irradiation+$PH_3$ exposure treatment+electron beam irradiation)

Following removal of the oxide film, the substrate was cooled to a temperature of not more than 200° C., and was then placed in the vacuum chamber of an AES apparatus. Following irradiation of the substrate surface with an electron beam at an accelerating voltage of 2 kV and an electron current of 50 μA, the substrate was transferred to the n-layer deposition chamber of a plasma-enhanced CVD apparatus. Next, a 0.6% $PH_3$ gas diluted with $H_2$ gas was introduced into the n-layer deposition chamber at 0.3 sccm/cm² and 0.1 Torr (13.3 Pa). The sheathed heater temperature was set so as to achieve a substrate temperature of approximately 150° C., and a $PH_3$ exposure treatment was performed for 5 minutes. Subsequently, the substrate was once again transferred to the vacuum chamber of the AES apparatus. Following irradiation of the substrate surface with an electron beam at an accelerating voltage of 2 kV and an electron current of 50 μA, the substrate was transferred to the i-layer deposition chamber of a plasma-enhanced CVD apparatus, and subsequent operations were performed in the same manner as the conditions 8 to deposit an i-type amorphous silicon layer and an n-type amorphous silicon layer.

Conditions 11: ($PH_3$ exposure treatment)

With the exception of not performing electron beam irradiation, a $PH_3$ exposure treatment and deposition of an i-type amorphous silicon layer and an n-type amorphous silicon layer were performed using the same stages as those described for the conditions 9.

Conditions 12: (Electron beam irradiation)

With the exception of not performing the $PH_3$ exposure treatment, electron beam irradiation and deposition of an i-type amorphous silicon layer and an n-type amorphous silicon layer were performed using the same stages as those described for the conditions 8.

Conditions 13: (No $PH_3$ exposure treatment+no electron beam irradiation)

Following removal of the oxide film, the substrate was cooled to a temperature of not more than 200° C., and was then transferred to the i-layer deposition chamber of a plasma-enhanced CVD apparatus. An i-type amorphous silicon layer and an n-type amorphous silicon layer were then deposited in the same manner as that described for the conditions 8.

The power generation characteristics of the solar cells prepared under the aforementioned conditions 8 to conditions 13 were evaluated.

Figure 14:
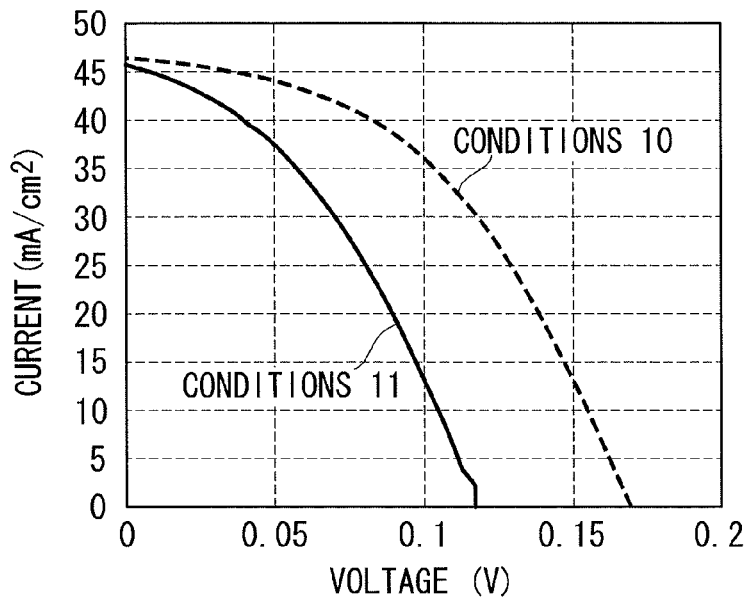
FIG. 14 shows a diagram illustrating the power generation characteristics of a solar cell.

The power generation characteristics of the solar cells prepared under conditions 10 and conditions 11 are illustrated in FIG. 14. In this figure, the horizontal axis represents the voltage and the vertical axis represents the current. As illustrated in FIG. 14, the solar cell in which electron beam irradiation was performed prior to the $PH_3$ exposure treatment stage (conditions 10) exhibited improved power generation characteristics compared with the solar cell in which no electron beam irradiation was performed (conditions 11). It is thought that this is because the energy from the electron beam causes a similar effect to increasing the substrate temperature during the $PH_3$ exposure treatment.

Table 5 shows the power generation characteristics for conditions 8 to conditions 13. In Table 5, the power generation characteristics for the solar cell of conditions 13 is used as the standard value (1.0)

TABLE 5

| Conditions | | Voc | Jsc | FF |
|---|---|---|---|---|
| Conditions 8 | Electron beam irradiation/$PH_3$ exposure | 1.25 | 1.08 | 1.25 |
| Conditions 9 | $PH_3$ exposure/electron beam irradiation | 1.21 | 1.11 | 1.21 |
| Conditions 10 | Electron beam irradiation/$PH_3$ exposure/electron beam irradiation | 1.48 | 1.09 | 1.31 |
| Conditions 11 | $PH_3$ exposure | 1.03 | 1.07 | 1.12 |
| Conditions 12 | Electron beam irradiation | 0.90 | 1.02 | 0.95 |
| Conditions 13 | No electron beam irradiation/no $PH_3$ exposure | 1.0 | 1.0 | 1.0 |

Table 5 reveals that performing only the electron beam irradiation (conditions 12) yielded power generation characteristics inferior to those of conditions 13. On the other hand, when the $PH_3$ exposure treatment and the electron beam irradiation were combined (conditions 8, conditions 9 and conditions 10), although a slight difference in the effect was observed depending on the order in which the treatments were performed, the power generation characteristics improved under each of the conditions. Specifically, in those cases where the electron beam irradiation was performed only once, the open-circuit voltage increased 21% to 25%, and the short-circuit current increased 8% to 11%. The cell characteristics for the solar cell produced under the conditions 10 (electron beam irradiation+$PH_3$ exposure treatment+electron beam irradiation) exhibited the greatest improvement, with the open-circuit voltage increasing 48% and the short-circuit current increasing 9%.

When electron beam irradiation was performed, the size of the improvement in the power generation characteristics obtained upon performing an annealing treatment diminished. This is similar to the tendency observed when electron beam irradiation was not performed, but the substrate temperature was increased when performing the $PH_3$ exposure treatment.

(Substrate Temperature Dependency)

Using the conditions 8 as a basis, solar cells were prepared with the substrate temperature during the $PH_3$ exposure treatment set to 100° C., 150° C. or 220° C.

Figure 15:
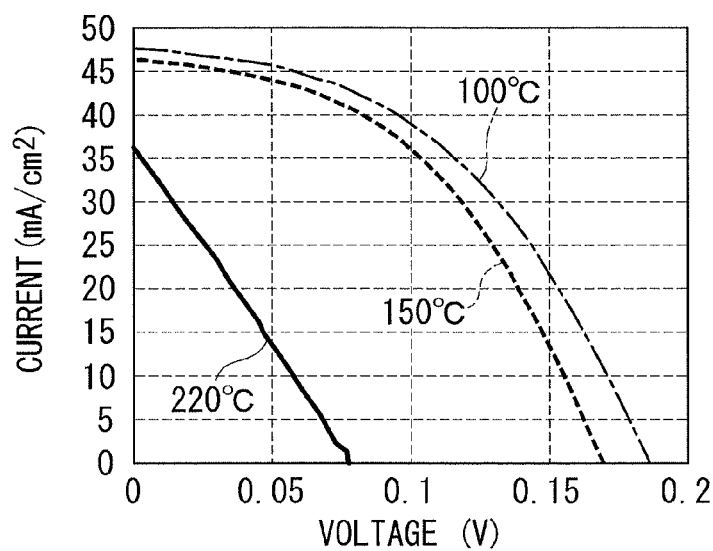
FIG. 15 shows a diagram illustrating the power generation characteristics of a solar cell.

The power generation characteristics of the thus prepared solar cells were evaluated. The results are illustrated in FIG. 15. In this figure, the horizontal axis represents the voltage and the vertical axis represents the current. As illustrated in FIG. 15, a higher substrate temperature resulted in lower power generation characteristics. It is surmised that this is because electron beam irradiation can be expected to cause an increase in the substrate temperature and an acceleration of the interface reaction, and therefore increasing the substrate temperature caused the reaction to proceed excessively.

Based on the above results, it can be stated that when an electron beam irradiation treatment stage is included, the substrate temperature during the $PH_3$ exposure treatment is preferably set to a low temperature of approximately 100° C.

Accordingly, it is evident that combining the $PH_3$ exposure treatment with electron beam irradiation can improve the power generation characteristics, and yields a similar effect to that observed by increasing the substrate temperature during the $PH_3$ exposure treatment, and is therefore an effective technique in those cases where, for process-related reasons, the substrate temperature cannot be increased.

Third Embodiment

Figure 16:
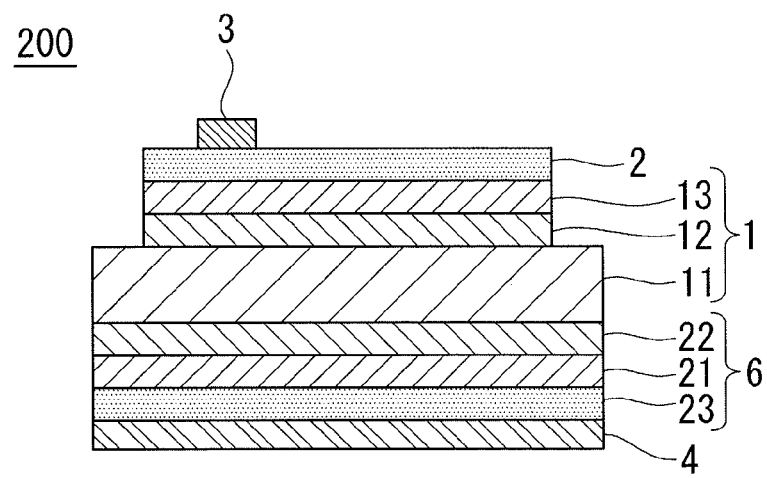
FIG. 16 shows a schematic view illustrating an example of the structure of a photovoltaic device according to a third embodiment.

FIG. 16 is a schematic view illustrating an example of the structure of a photovoltaic device according to this embodiment. The photovoltaic device 200 is a solar cell comprising heterostructures on both surfaces of the substrate, and comprises a heterojunction cell layer 1, a back surface heterojunction layer 6, a transparent electrode layer 2, a grid electrode 3 and a back electrode layer 4.

The back surface heterojunction layer 6 comprises a p-type amorphous silicon layer 21, and is provided between the substrate 11 and the back electrode layer 4. The p-type amorphous silicon layer comprises mainly B-doped amorphous silicon, and has a thickness of not less than 4 nm and not more than 30 nm.

An i-type amorphous silicon layer 22 is preferably disposed between the substrate 11 and the p-type amorphous silicon layer 21. The i-type amorphous silicon layer 22 comprises mainly amorphous silicon, and has a thickness of not less than 4 nm and not more than 20 nm.

A transparent conductive layer 23 is preferably disposed between the p-type amorphous silicon layer 21 and the back electrode layer 4. The transparent conductive layer 23 is a film comprising a metal oxide such as indium tin oxide (ITO), tin oxide ($SnO_2$) or zinc oxide (ZnO) as the main component. The thickness of the transparent conductive layer 23 is not less than 50 nm and not more than 150 nm.

With the exceptions of including a back surface heterojunction layer formation stage of forming the back surface heterostructure between the heterojunction cell preparation stage and the electrode formation stage, and not performing the annealing treatment, the process used for producing the photovoltaic device according to this embodiment comprises the same stages as those of the first embodiment.

(Back Surface Heterojunction Layer Formation Stage)

Following the heterojunction cell preparation stage, the substrate 11 is placed inside a deposition chamber for the i-type amorphous silicon layer (namely, an i-layer deposition chamber) within a plasma-enhanced CVD apparatus. At this time, the substrate 11 is inverted. The i-type amorphous silicon layer 22 is deposited on the surface of the substrate 11 opposite the surface on which the i-type amorphous silicon layer 12 has been deposited (namely, the back surface), under conditions including a raw material gas composed of $SiH_4$ gas and $H_2$ gas, a reduced pressure atmosphere of not less than 1 Pa and not more than 1,000 Pa, and a substrate temperature of approximately 150° C.

Next, the substrate 11 is transferred to a deposition chamber for the p-type amorphous silicon layer (namely, a p-layer deposition chamber), and the p-type amorphous silicon layer 21 is deposited on the i-type amorphous silicon layer 22 under conditions including a raw material gas composed of $SiH_4$ gas, $H_2$ gas and $B_2H_6$ gas, a reduced pressure atmosphere of not less than 1 Pa and not more than 1,000 Pa, and a substrate temperature of approximately 150° C.

Subsequently, the substrate 11 is placed inside a sputtering apparatus, and the transparent conductive layer 23 is formed on top of the p-type amorphous silicon layer 21 by radio-frequency (RF) sputtering. The sputtering conditions include an ITO sintered compact as the target, an atmospheric gas of Ar, an ultimate pressure of $10^{-4}$ Pa to $10^{-5}$ Pa, and a high-frequency power of 2 $W/cm^2$ to 3 $W/cm^2$.

A solar cell of the structure described below (double-sided heterojunction) was produced in accordance with the third embodiment.

Grid electrode: Ag film, average thickness 200 nm
Transparent electrode layer: ITO film, average thickness 70 nm
n-type amorphous silicon layer: average thickness 7 nm
i-type amorphous silicon layer: average thickness 40 nm
p-type monocrystalline Ge layer: average thickness 175 μm
i-type amorphous silicon layer (back surface): average thickness 0 nm (no back surface i-layer)
p-type amorphous silicon layer (back surface): average thickness 15 nm
Transparent conductive layer: ITO film, average thickness 70 nm
Back electrode layer: Al film, average thickness 200 nm Further, for the purpose of comparison, a solar cell having no back surface heterojunction layer (single-sided heterojunction) was also prepared.

A p-type monocrystalline Ge having an orientation of Ge (100), a resistance of 3.2 Ωcm, and a carrier density of $7.1 \times 10^{14}/cm^3$ to $2.6 \times 10^{17}/cm^3$ was used.

The $PH_3$ exposure treatment stage was performed in the manner described below.

Namely, the substrate was cooled to a temperature of not more than 200° C., and was then placed inside an i-layer deposition chamber. A 0.6% $PH_3$ gas diluted with $H_2$ gas was then introduced into the vacuum chamber at 0.3 $sccm/cm^2$ and 0.1 Torr (13.3 Pa). The sheathed heater temperature was set so as to achieve a substrate temperature of approximately 150° C., and a $PH_3$ exposure treatment was performed for 5 minutes.

Figure 17:
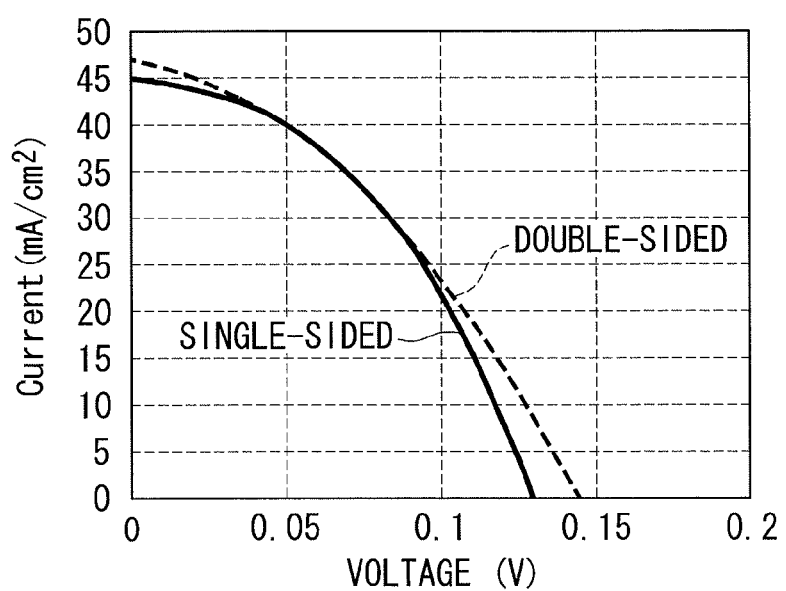
FIG. 17 shows a diagram illustrating the power generation characteristics of a solar cell.

The power generation characteristics of the thus prepared solar cells were evaluated. The results are shown in FIG. 17. In this figure, the horizontal axis represents the voltage, and the vertical axis represents the current. FIG. 17 reveals that the solar cell comprising the back surface heterojunction layer (the double-sided heterojunction) exhibited improved short-circuit current and open-circuit voltage compared with the solar cell having only the heterojunction cell layer (single-sided heterojunction). It is thought that this effect is due to reduced recombination at the back surface as a result of providing the back surface heterojunction layer. Based on the above results, it was evident that providing a heterostructure on both surfaces of the p-type monocrystalline Ge can improve the short-circuit current and the open-circuit voltage.

In the solar cells prepared above, the improvement in the fill factor (FF) was minimal due to the increase in the series resistance, but further improvements in the performance can be expected by improving the contact resistance.

REFERENCE SIGNS LIST

1 Heterojunction cell layer
2 Transparent electrode layer
3 Grid electrode
4 Back electrode layer
5 Oxide film
6 Back surface heterojunction layer
11 Substrate (p-type monocrystalline Ge)
12 i-type amorphous silicon semiconductor layer
13 n-type amorphous silicon semiconductor layer
100 Photovoltaic device

The invention claimed is:

1. A process for producing a photovoltaic device comprising a p-type crystalline Ge as a substrate, and a heterojunction cell prepared by sequentially stacking an i-type amorphous silicon semiconductor layer and an n-type amorphous silicon semiconductor layer on top of the substrate, the process comprising:

a $PH_3$ exposure treatment stage of adjusting a temperature of the substrate, from which an oxide film formed on a surface thereof has been removed, to a prescribed temperature, and subsequently placing the substrate in a vacuum chamber and exposing the substrate to $PH_3$ gas, an i-layer deposition stage of depositing the i-type amorphous silicon semiconductor layer on the substrate that has been exposed to $PH_3$, an n-layer deposition stage of depositing the n-type amorphous silicon semiconductor layer on the i-type amorphous silicon semiconductor layer, and an electrode formation stage of forming an electrode on the n-type amorphous silicon semiconductor layer, and forming an electrode on a surface of the substrate opposite a surface on which the i-type amorphous silicon semiconductor layer has been deposited.

2. The process for producing a photovoltaic device according to claim 1, wherein the prescribed temperature for the substrate in the $PH_3$ exposure treatment stage is not less than 150° C.

3. The process for producing a photovoltaic device according to claim 1, further comprising, after the electrode formation stage, an annealing treatment stage of applying heat to perform an annealing treatment.

4. The process for producing a photovoltaic device according to claim 1, further comprising, at least one of prior to the $PH_3$ exposure treatment stage or after the $PH_3$ exposure treatment stage, an electron beam irradiation stage of irradiating an electron beam onto the substrate.

5. The process for producing a photovoltaic device according to claim 1, wherein a p-type crystalline Ge having a thickness of not less than 1.5 μm and not more than 500 μm is used as the substrate.

6. The process for producing a photovoltaic device according to claim 1, further comprising, prior to the electrode formation stage, a back surface heterostructure formation stage of forming a p-type amorphous silicon semiconductor layer on the surface of the substrate opposite the surface on which the i-type amorphous silicon semiconductor layer has been deposited.

7. The process for producing a photovoltaic device according to claim 1, wherein the prescribed temperature for the substrate in the $PH_3$ exposure treatment stage is 100° C.

* * * * *